United States Patent
Chen et al.

(10) Patent No.: US 10,211,080 B2
(45) Date of Patent: Feb. 19, 2019

(54) ROBOT ARMS AND METHOD FOR ALIGNING SUBSTRATE WITH THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xin Chen, Beijing (CN); Chao Gao, Beijing (CN); Qingyang Yao, Beijing (CN); Jianghua Qi, Beijing (CN); Yujiang Cheng, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 141 days.

(21) Appl. No.: 15/291,424

(22) Filed: Oct. 12, 2016

(65) Prior Publication Data
US 2017/0271189 A1    Sep. 21, 2017

(30) Foreign Application Priority Data
Mar. 18, 2016 (CN) .......................... 2016 1 0158135

(51) Int. Cl.
*H01L 21/68* (2006.01)
*G06T 7/73* (2017.01)
(Continued)

(52) U.S. Cl.
CPC .............. *H01L 21/68* (2013.01); *G06T 7/004* (2013.01); *G06T 7/74* (2017.01); *B25J 9/1679* (2013.01);
(Continued)

(58) Field of Classification Search
CPC .... H01L 21/68; G06K 9/00664; G06K 9/209; G06T 7/0004; G06T 7/004;
(Continued)

(56) References Cited

U.S. PATENT DOCUMENTS 6,188,467 B1    2/2001  Yamatsu et al.
6,409,463 B1*   6/2002  Croft et al. ............. H01L 21/68
                                                        414/754
(Continued)

FOREIGN PATENT DOCUMENTS

| CN | 103313525 A | 9/2013 |
| JP | 2002176092 A | 6/2002 |
| KR | 100716301 B1 | 5/2007 |

OTHER PUBLICATIONS

First Office Action for Chinese Application No. 201610158135.X, dated Dec. 29, 2017, 7 Pages.

*Primary Examiner* — Abby Y Lin
(74) *Attorney, Agent, or Firm* — Brooks Kushman P.C.

(57) ABSTRACT

The present disclosure provides a robot arm, including a pedestal, a support arm on the pedestal and configured to support a substrate, a driving system configured to drive the support arm to move, and a substrate alignment device connected to the support arm. The substrate alignment device includes a first position information collection unit configured to acquire first position information of the substrate when the substrate is on the support arm at a first position; a deviation information acquisition unit configured to acquire position deviation information of the substrate in accordance with the first position information and second position information of the substrate in the case that the substrate is located at a standard position, and an adjustment unit configured to generate control information in accor-
(Continued)

dance with the position deviation information, thereby driving the support arm by the driving system to place the substrate at a target position.

10 Claims, 4 Drawing Sheets

(51) Int. Cl.
    *B25J 9/16*     (2006.01)
    *G06T 7/00*     (2017.01)
    *G06K 9/32*     (2006.01)

(52) U.S. Cl.
    CPC .. *G06K 9/3216* (2013.01); *G06T 2207/30121* (2013.01); *G06T 2207/30204* (2013.01)

(58) Field of Classification Search
    CPC . G06T 2207/10004; G06T 2207/30121; G06T 2207/30204; B25J 9/1679
    See application file for complete search history.

(56) References Cited

U.S. PATENT DOCUMENTS

2003/0083776 A1* 5/2003 Schauer ................ B23Q 3/186
                                                                 700/218
2014/0340509 A1* 11/2014 Fairbairn ................ H04N 7/18
                                                                  348/95

\* cited by examiner

ROBOT ARMS AND METHOD FOR ALIGNING SUBSTRATE WITH THE SAME

CROSS-REFERENCE TO RELATED APPLICATIONS

This application claims priority to Chinese Patent Application No. 201610158135.X filed on Mar. 18, 2016, the disclosure of which is incorporated in its entirety by reference herein.

TECHNICAL FIELD

The present disclosure relates to the field of manufacturing liquid crystal products, in particular to a robot arm and a method for aligning substrates with the same.

BACKGROUND

A thin film transistor-liquid crystal display (TFT-LCD) has become a mainstream product in the current flat-panel display market due to its advantages such as small volume, low power consumption and being free of radiation. There is a very strict requirement of a dust level in a production environment during the manufacture of the TFT-LCD, especially for processes before the packaging. This is because the product quality may be seriously affected by the dust. In order to reduce the dust level as well as a manipulation degree, a large number of automatic conveyance devices are used during the manufacture of the TFT-LCD, and meanwhile a robot arm is used to join the devices. However, in the case that a glass substrate is delivered by an upstream device erroneously, it may be located on the robot arm at an erroneous position, and thereby it may be damaged due to a collision with a downstream device.

To overcome this drawback, the robot arm is provided with an optical fiber sensor by some manufacturers, so as to sense positions of the glass substrate and the robot arm, thereby to determine a relative position of the glass substrate to the robot arm. However, there are also the following drawbacks.

1. In order to enable the glass substrate to be at a predetermined position on the robot arm, picking and placing actions may be repeated by the robot arm, so as to adjust the relative position of the glass substrate to the robot arm. This procedure is complex and time-consuming, so the tact time will be reduced.

2. This method may merely be used to detect deviations in a front-and-back direction as well as angular deviations, rather than deviations in left-and-right direction, so it is still impossible to prevent the occurrence of deviation completely.

SUMMARY

An object of the present disclosure is to provide a robot arm and a method for aligning a substrate, so as to prevent the collision of the substrate with a downstream device.

In one aspect, the present disclosure provides in some embodiments a robot arm, including a pedestal, a support arm on the pedestal and configured to support a substrate, a driving system configured to drive the support arm to move, and a substrate alignment device connected to the support arm. The substrate alignment device includes: a first position information collection unit configured to acquire first position information of the substrate when the substrate is on the support arm at a first position; a deviation information acquisition unit configured to acquire position deviation information of the substrate in accordance with the first position information and second position information of the substrate in the case that the substrate is located at a standard position; and an adjustment unit configured to generate control information in accordance with the position deviation information, so as to drive the support arm by the driving system, thereby to place the substrate at a target position.

Optionally, the robot arm further includes a storage unit configured to store therein the second position information and target position information.

Optionally, the first position information collection unit includes an image sensor on the pedestal and below the support arm, and in the case that the substrate is located at the standard position, a predetermined positioning mark on the substrate coincides with a central point of a viewing field of the image sensor.

Optionally, a first image sensor and a second image sensor are arranged on the pedestal at positions corresponding to two opposite sides of the support arm respectively, and a first positioning mark corresponding to the first image sensor and a second positioning mark corresponding to the second image sensor are arranged on the substrate.

Optionally, in the case that the substrate is located at the standard position, a central point of a viewing field of the first image sensor on the substrate, a central point of a viewing field of the second image sensor on the substrate and a central point of the substrate are in an identical straight line.

Optionally, the driving system includes: a first driving mechanism configured to control the support arm to move in a first direction in accordance with the control information from the adjustment unit; a second driving mechanism configured to control the support arm to move in a second direction perpendicular to the first direction in accordance with the control information from the adjustment unit; and a third driving mechanism configured to control the support arm to rotate in accordance with the control information from the adjustment unit.

Optionally, the position deviation information includes a first deviation amount Y, a second deviation amount and an angular deviation amount θ. The first deviation amount Y meets a formula $Y=(Y_{2k}-Y_{1k})/2$, where $Y_{1k}$ represents a distance in the first direction between a position of the first positioning mark and the central point of the viewing field of the first image sensor on the substrate in the case that the substrate is located at a current position, and $Y_{2k}$ represents a distance in the first direction between a position of the second positioning mark and the central point of the viewing field of the second image sensor on the substrate in the case that the substrate is located at the current position. The second deviation amount is a distance in the second direction between the position of the first positioning mark and the central point of the viewing field of the first image sensor on the substrate in the case that the substrate is located at the current position. The distance in the second direction between the position of the first positioning mark and the central point of the viewing field of the first image sensor on the substrate is equal to a distance in the second direction between the position of the second positioning mark and the central point of the viewing field of the second image sensor on the substrate.

$$\mathrm{Sin}\theta = \frac{Y_{2k}-Y_{1k}}{L},$$

where $Y_{1k}$ represents the distance in the first direction between the position of the first positioning mark and the central point of the viewing field of the first image sensor on the substrate in the case that the substrate is located at the current position, $Y_{2k}$ represents the distance in the first direction between the position of the second positioning mark and the central point of the viewing field of the second image sensor on the substrate in the case that the substrate is located at the current position, and L represents a distance between the central point of the viewing field of the first image sensor on the substrate and the central point of the viewing field of the second image sensor on the substrate.

In another aspect, the present disclosure provides in some embodiments a method for aligning a substrate with the above-mentioned robot arm, including steps of: acquiring first position information of a substrate in the case that the substrate is supported on a support arm at a first position; acquiring position deviation information of the substrate in accordance with the first position information and second position information of the substrate in the case that the substrate is located at a standard position; and generating control information in accordance with the position deviation information, so as to enable a driving system to drive the support arm to move, thereby to place the substrate at a target position.

Optionally, the first position information is acquired by a first image sensor and a second image sensor, and a first positioning mark corresponding to the first image sensor and a second positioning mark corresponding to the second image sensor are arranged on the substrate. In the case that the substrate is located at the standard position, a central point of a viewing field of the first image sensor on the substrate, a central point of a viewing field of the second image sensor on the substrate and a central point of the substrate are in an identical straight line.

Optionally, the position deviation information includes a first deviation amount Y, a second deviation amount and an angular deviation amount θ. $Y=(Y_{2k}-Y_{1k})/2$, where $Y_{1k}$ represents a distance in a first direction between a position of the first positioning mark and the central point of the viewing field of the first image sensor on the substrate in the case that the substrate is located at a current position, and $Y_{2k}$ represents a distance in the first direction between a position of the second positioning mark and the central point of the viewing field of the second image sensor on the substrate in the case that the substrate is located at the current position. The second deviation amount is a distance in a second direction between the position of the first positioning mark and the central point of the viewing field of the first image sensor on the substrate in the case that the substrate is located at the current position. The distance in the second direction between the position of the first positioning mark and the central point of the viewing field of the first image sensor on the substrate is equal to a distance in the second direction between the position of the second positioning mark and the central point of the viewing field of the second image sensor on the substrate.

$$Sin\theta = \frac{Y_{2k}-Y_{1k}}{L},$$

where $Y_{1k}$ represents the distance in the first direction between the position of the first positioning mark and the central point of the viewing field of the first image sensor on the substrate in the case that the substrate is located at the current position, $Y_{2k}$ represents the distance in the first direction between the position of the second positioning mark and the central point of the viewing field of the second image sensor on the substrate in the case that the substrate is located at the current position, and L represents a distance between the central point of the viewing field of the first image sensor on the substrate and the central point of the viewing field of the second image sensor on the substrate.

Optionally, the method further includes: controlling the support arm to move in the first direction in accordance with the first deviation amount; controlling the support arm to move in the second direction perpendicular to the first direction in accordance with the second deviation amount; and controlling the support arm to rotate in accordance with the angular deviation amount.

According to the embodiments of the present disclosure, through the substrate alignment device, the position deviation information of the substrate may be acquired automatically, and the position deviation of the substrate may be modified automatically without changing the relative position relationship between the robot arm and the substrate, i.e., no additional action of the robot arm is required. As a result, it is able to prevent the collision of the substrate and reduce the tact time.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The present disclosure will be described hereinafter in conjunction with the drawings and embodiments. The following embodiments are for illustrative purposes only, but shall not be used to limit the scope of the present disclosure.

Figure 1:
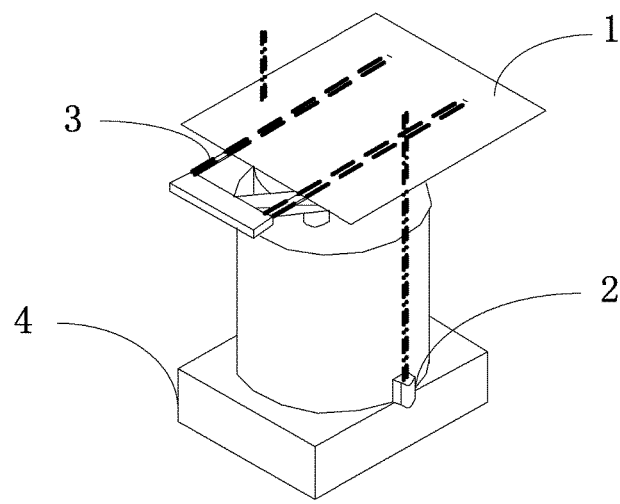
FIG. 1 is a schematic view of a robot arm according to one embodiment of the present disclosure.
Figure 5:
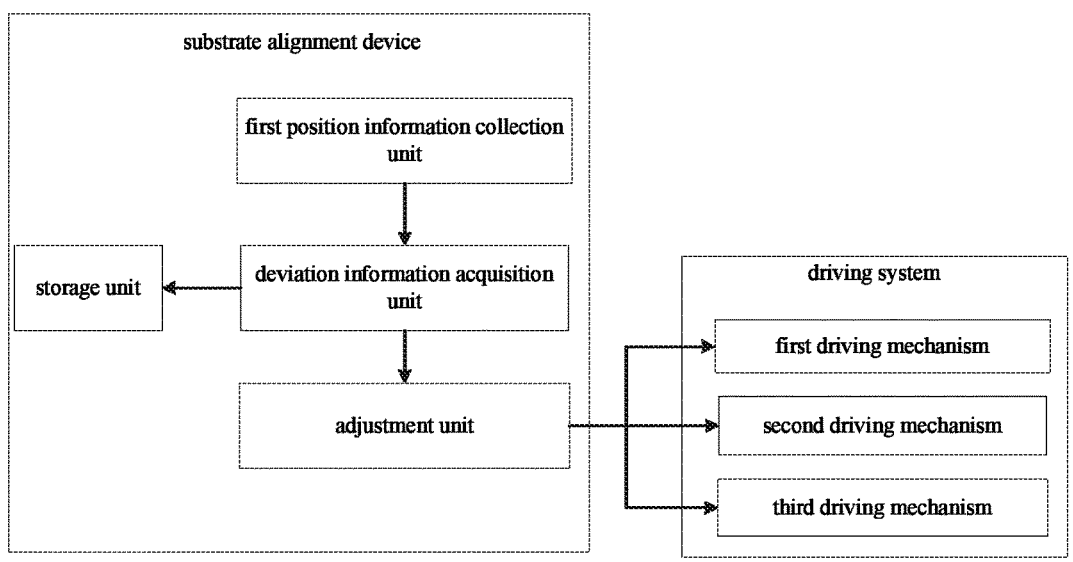
FIG. 5 is a schematic view showing a driving system and a substrate alignment device of the robot arm according to one embodiment of the present disclosure.

As shown in FIG. 1, the present disclosure provides in some embodiments a robot arm, which includes a pedestal 4, a support arm 3 arranged on the pedestal 4 and configured to support a substrate 1, a driving system configured to drive the support arm 3 to move, and a substrate alignment device connected to the support arm 3. As shown in FIG. 5, the substrate alignment device includes: a first position information collection unit, a deviation information acquisition unit and an adjustment unit.

The first position information collection unit is to acquire first position information of the substrate 1 when the substrate 1 is supported on the support arm at a first position.

The deviation information acquisition unit is to acquire position deviation information of the substrate 1 in accordance with the first position information and second position information of the substrate 1 when the substrate 1 is located at a standard position.

The adjustment unit is to generate control information in accordance with the position deviation information, so as to drive the support arm by the driving system, thereby to place the substrate 1 at a target position.

Through the substrate alignment device, the position deviation information of the substrate 1 may be acquired automatically. Here, the position deviation information is position deviation information of the substrate 1 in the case that the substrate 1 is deviated from the support arm supporting the substrate 1. It is able to modify the position deviation of the substrate 1 automatically without changing the relative position relationship between the robot arm and the substrate 1, i.e., to modify target position information of the substrate 1 in the case that the substrate 1 is located at the target position. In this way, it is merely necessary for the robot arm to pick the substrate 1 from an upstream device, and place the substrate 1 onto a downstream device (the target position) in accordance with the target position information. The acquisition of the position deviation information of the substrate 1 and the modification of the position deviation are both performed during the movement of the substrate 1 from the upstream device to the downstream device through the robot arm, i.e., no additional action of the robot arm is desired. As a result, it is able to reduce the time for aligning the substrate 1, and present the collision of the substrate 1 due to the position deviation.

The robot arm further includes a storage unit. The storage unit is to store therein the second position information and the target position information.

When the deviation information acquisition unit compares the first position information with the second position information and the acquired position deviation information is zero, i.e., the substrate 1 is located at the standard position, the adjustment unit may not generate any control information. Then, the support arm may convey the substrate 1 to the target position in accordance with the predetermined target position information.

In the case that the deviation information acquisition unit compares the first position information with the second position information and the acquired position deviation information indicates that a position deviation occurs, the adjustment unit may generate the control information for controlling the driving system in accordance with the position deviation information from the deviation information acquisition unit, so as to enable the driving system to drive the support arm to move in accordance with the target position information, thereby to place the substrate 1 at the target position.

To be specific, the first position information collection unit includes an image sensor arranged on the pedestal 4.

The image sensor is below the support arm. When the substrate 1 is located at the standard position, a predetermined positioning mark on the substrate 1 coincides with a central point of a viewing field of the image sensor.

In the case that, in image information collected by the image sensor, the predetermined positioning mark on the substrate 1 coincides with the central point of the viewing field of the image sensor, it means that the substrate 1 is located at the standard position of the support arm, and no position deviation occurs. In the case that the predetermined positioning mark on the substrate 1 is deviated from the central point of the viewing field of the image sensor, it means that the substrate 1 is deviated from the support arm.

Figure 2:
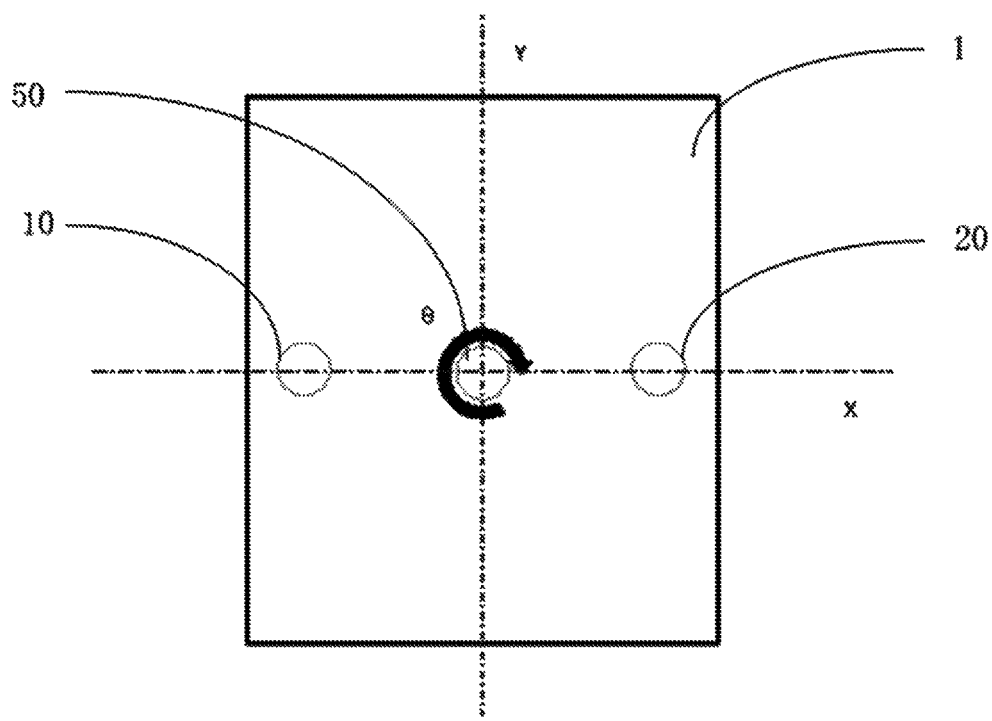
FIG. 2 is a schematic view showing positions of positioning marks when a substrate is located at a standard position according to one embodiment of the present disclosure.

However, there is such a condition where only one image sensor is provided and only one positioning mark is provided on the substrate 1. In the case that the substrate 1 is rotated, it may be deviated from the standard position. At this point, in the image information collected by the image sensor, the positioning mark on the substrate 1 may also coincide with the central point of the viewing field of the image sensor, so misjudgment may occur. In order to overcome this drawback, in some embodiments of the present disclosure, a first image sensor and a second image sensor 2 may be arranged on the pedestal 4 at positions corresponding to two opposite sides of the support arm respectively. A first positioning mark 10 corresponding to the first image sensor and a second positioning mark 20 corresponding to the second image sensor 2 may be arranged on the substrate 1, as shown in FIGS. 1-2.

It should be appreciated that, the positioning mark on the substrate 1 may be that for any other process, i.e., it is unnecessary to provide no additional positioning mark. In addition, the image sensor may be arranged at any position according to the practical need, as long as the central point of the viewing field of the image sensor is at a fixed position relative to the positioning mark during the data collection.

The first image sensor and the second image sensor may each be a charge-coupled device (CCD).

Optionally, in the case that the substrate 1 is located at the standard position, a central point of a viewing field of the first image sensor on the substrate 1, a central point of a viewing field of the second image sensor 2 on the substrate 1 and a central point 50 of the substrate 1 may be in an identical straight line.

As shown in FIG. 2, in the case that the substrate 1 is located at the standard position on the support arm, the first positioning mark 10 may coincide with the central point (i.e., a cross sign) of the viewing field of the first image sensor, and the second positioning mark 20 may coincide with the central point (i.e., a cross sign) of the viewing field of the second image sensor 2. Through adjusting the positions, it is able to ensure that the central point of the viewing field of the first image sensor, the central point of the viewing field of the second image sensor and the central point 50 of the substrate 1 are in the same straight line, and the central point 50 of the substrate 1 is just a middle point of a line connecting the central point of the viewing field of the first image sensor and the central point of the viewing field of the second image sensor 2.

As shown in FIG. 5, the driving system includes a first driving mechanism, a second driving mechanism and a third driving mechanism.

The first driving mechanism is to control the support arm to move in a first direction in accordance with the control information from the adjustment unit. The first direction may be an X direction shown in FIG. 2.

The second driving mechanism is to control the support arm to move in a second direction perpendicular to the first direction in accordance with the control information from the adjustment unit. The second direction may be a Y direction shown in FIG. 2.

The third driving mechanism is to control the support arm to rotate in accordance with the control information from the adjustment unit.

The position deviation information includes a first deviation amount Y, a second deviation amount and an angular deviation amount θ.

The first deviation amount Y may be obtained via a formula Y=($Y_{2k}$−$Y_{1k}$)/2, where $Y_{1k}$ represents a distance in the first direction between a position of the first positioning mark 10 and the central point of the viewing field of the first image sensor on the substrate 1 when the substrate 1 is located at a current position, and $Y_{2k}$ represents a distance in the first direction between a position of the second positioning mark 20 and the central point of the viewing field of the second image sensor 2 on the substrate 1 when the substrate 1 is located at the current position.

The second deviation amount is a distance in the second direction between the position of the first positioning mark 10 and the central point of the viewing field of the first image sensor on the substrate 1 in the case that the substrate 1 is located at the current position.

The distance in the second direction between the position of the first positioning mark 10 and the central point of the viewing field of the first image sensor on the substrate 1 is equal to a distance in the second direction between the position of the second positioning mark 20 and the central point of the viewing field of the second image sensor 2 on the substrate 1.

The angular deviation amount θ meets a formula $$\mathrm{Sin}\theta = \frac{Y_{2k} - Y_{1k}}{L},$$

where $Y_{1k}$ represents the distance in the first direction between the position of the first positioning mark 10 and the central point of the viewing field of the first image sensor on the substrate 1 in the case that the substrate 1 is located at the current position, $Y_{2k}$ represents the distance in the first direction between the position of the second positioning mark 20 and the central point of the viewing field of the second image sensor 2 on the substrate 1 in the case that the substrate 1 is located at the current position (i.e., the first position), and L represents a distance between the central point of the viewing field of the first image sensor on the substrate 1 and the central point of the viewing field of the second image sensor 2 on the substrate 1.

The acquisition of the position deviation information will be described hereinafter.

Figure 3:
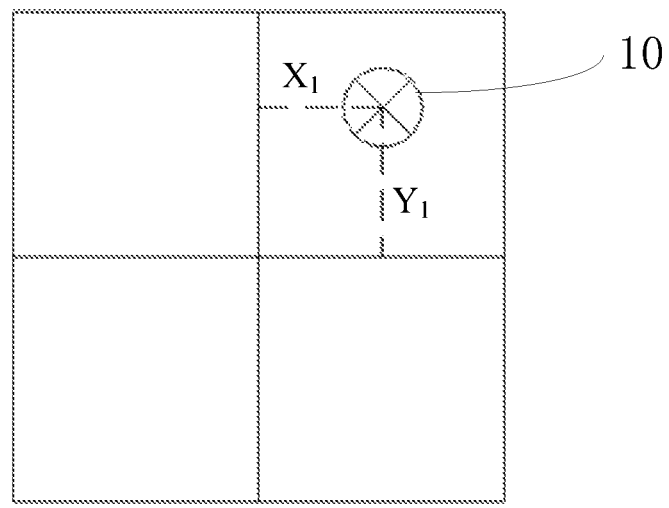
FIG. 3 is a schematic view showing a position of a first positioning mark when the substrate is located at a current position according to one embodiment of the present disclosure.
Figure 4:
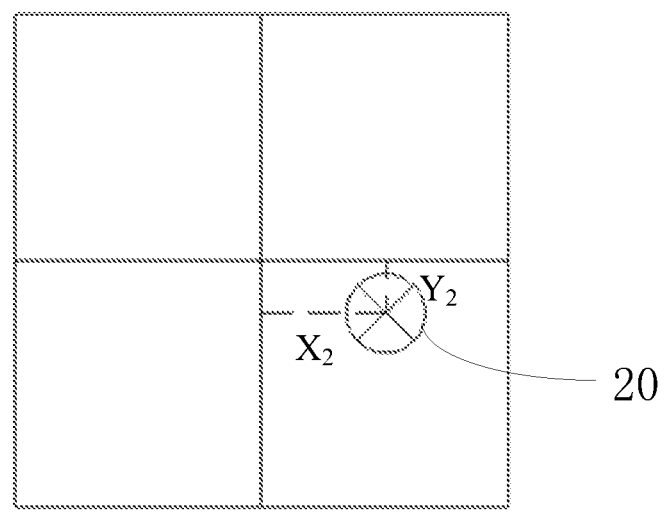
FIG. 4 is a schematic view showing a position of a second positioning mark when the substrate is located at the current position according to one embodiment of the present disclosure.

As shown in FIGS. 3 and 4, in the case that the substrate 1 is located at the first position, a deviation amount of the first positioning mark 10 in the first direction is $X_1$, a deviation amount of the first positioning mark 10 in the second direction is $Y_1$, a deviation amount of the second positioning mark 20 in the first direction is $X_2$, and a deviation amount of the second positioning mark 20 in the second direction is $Y_2$. $X_1$, $Y_1$, $X_2$ and $Y_2$ are each in unit of pixels. The distance between the central point of the viewing field of the first image sensor and the central point of the viewing field of the second image sensor 2 is L.

Because $X_1$, $Y_1$, $X_2$ and $Y_2$ are each in unit of pixels, it is required to convert it into length unit. A proportion of an actual image size to the number of the pixels may be acquired through the first image sensor and the second image sensor 2. This proportion may be a constant K. Then, the deviation amount $X_{1k}$ of the first positioning mark 10 deviated from the central point of the viewing field of the first image sensor in the first direction is $X_1$*K, the deviation amount $Y_{1k}$ of the first positioning mark 10 deviated from the central point of the viewing field of the first image sensor in the second direction is $Y_1$*K. The deviation amount $X_{2k}$ of the second positioning mark 20 deviated from the central point of the viewing field of the second image sensor 2 in the first direction is $X_2$*K, and the deviation amount $Y_{2k}$ of the second positioning mark 20 deviated from the central point of the viewing field of the second image sensor 2 in the second direction is $Y_2$*K. $X_{1k}$, $Y_{1k}$, $X_{2k}$ and $Y_{2k}$ are each in unit of millimeters.

Because the central point of the substrate 1 is just the middle point of the line connecting the central point of the viewing field of the first image sensor and the central point of the viewing field of the second image sensor, the first deviation amount Y is ($Y_{2k}$−$Y_{1k}$)/2.

Because the distance between the first positioning mark 10 and the second positioning mark 20 on the substrate 1 is constant, the second deviation amount X is equal to $X_{1k}$ and $X_{2k}$.

According to a trigonometric formula, the angular deviation amount θ meets a formula $$\mathrm{Sin}\theta = \frac{Y_{2k} - Y_{1k}}{L}.$$

In the case that the substrate 1 is placed at the target position, the adjustment unit may generate new target position information in accordance with the position deviation information and the predetermined target position information (by subtracting the deviation amount from the original target position information), and then generate the control information in accordance with the new target position information, so as to enable the driving system to drive the support arm to move, thereby to place the substrate at the target position without any collision.

Through the substrate alignment device, the position deviation information of the substrate 1 may be acquired automatically, the predetermined target position information may be modified in accordance with the position deviation information, so as to acquire the new target position information, and then the control information may be generated in accordance with the new target position information, so as to enable the driving system to drive the support arm to move, thereby to place the substrate 1 at the correct target position, without changing the relative position between the substrate 1 and the support arm or performing any additional action of the support arm. As a result, it is able to convey the substrate 1 to the target position without any collision.

Figure 6:
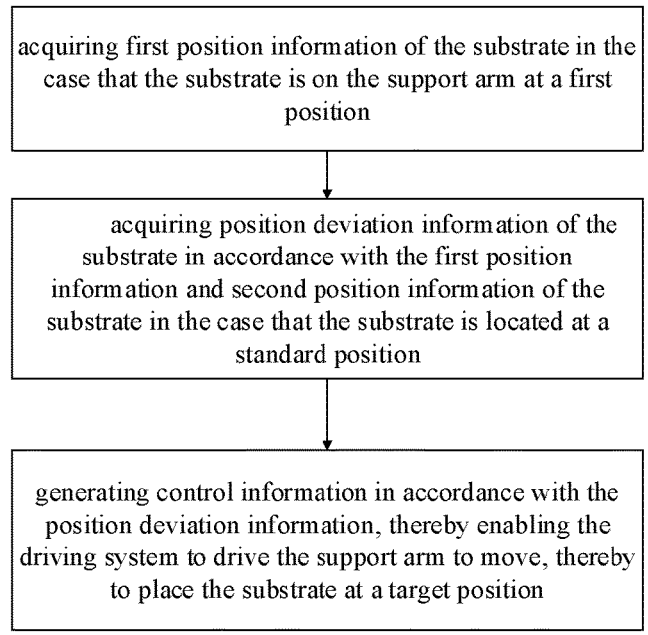
FIG. 6 is a flowchart of a method for aligning a substrate according to one embodiment of the present disclosure.

The present disclosure further provides in some embodiments a method for aligning a substrate by using the above-mentioned robot arm, as shown in FIG. 6, which includes steps of: acquiring the first position information of the substrate 1 when the substrate 1 is supported on the support arm at the first position; acquiring position deviation information of the substrate 1 in accordance with the first position information and the second position information of the substrate 1 when the substrate 1 is located at the standard position; and generating the control information in accordance with the position deviation information, so as to enable the driving system to drive the support arm to move, thereby to place the substrate 1 at a target position.

The first position information is acquired by the first image sensor and the second image sensor 2, and the first positioning mark 10 corresponding to the first image sensor and the second positioning mark 20 corresponding to the second image sensor 2 are arranged on the substrate 1.

In the case that the substrate 1 is located at the standard position, the central point of the viewing field of the first image sensor on the substrate 1, the central point of the viewing field of the second image sensor 2 on the substrate 1 and the central point of the substrate 1 are in an identical straight line.

The position deviation information includes the first deviation amount Y, the second deviation amount and the angular deviation amount θ.

The first deviation amount Y meets a formula $Y=(Y_{2k}-Y_{1k})/2$, where $Y_{1k}$ represents a distance in the first direction between a position of the first positioning mark 10 and the central point of the viewing field of the first image sensor on the substrate 1 in the case that the substrate 1 is located at a current position, and $Y_{2k}$ represents a distance in the first direction between a position of the second positioning mark 20 and the central point of the viewing field of the second image sensor 2 on the substrate 1 in the case that the substrate 1 is located at the current position.

The second deviation amount is a distance in the second direction between the position of the first positioning mark 10 and the central point of the viewing field of the first image sensor on the substrate 1 in the case that the substrate 1 is located at the current position.

The distance in the second direction between the position of the first positioning mark 10 and the central point of the viewing field of the first image sensor on the substrate 1 is equal to a distance in the second direction between the position of the second positioning mark 20 and the central point of the viewing field of the second image sensor 2 on the substrate 1.

The angular deviation amount θ meets a formula $$\sin\theta = \frac{Y_{2k} - Y_{1k}}{L},$$

where $Y_{1k}$ represents the distance in the first direction between the position of the first positioning mark 10 and the central point of the viewing field of the first image sensor on the substrate 1 in the case that the substrate 1 is located at the current position, $Y_{2k}$ represents the distance in the first direction between the position of the second positioning mark 20 and the central point of the viewing field of the second image sensor 2 on the substrate 1 in the case that the substrate 1 is located at the current position, and L represents a distance between the central point of the viewing field of the first image sensor on the substrate 1 and the central point of the viewing field of the second image sensor 2 on the substrate 1.

Figure 7:
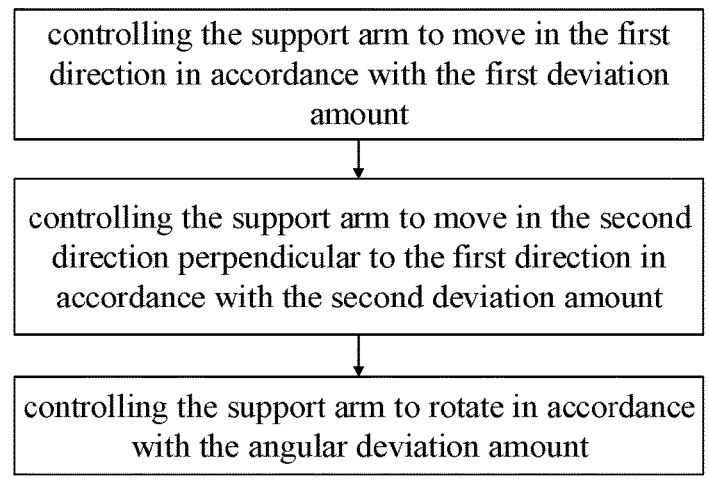
FIG. 7 is a flowchart of driving a support arm to move according to one embodiment of the present disclosure.

As shown in FIG. 7, the method for aligning the substrate further includes: controlling the support arm to move in the first direction in accordance with the first deviation amount; controlling the support arm to move in the second direction perpendicular to the first direction in accordance with the second deviation amount; and controlling the support arm to rotate in accordance with the angular deviation amount.

The above are merely the preferred embodiments of the present disclosure. Obviously, a person skilled in the art may make further modifications and improvements without departing from the spirit of the present disclosure, and these modifications and improvements shall also fall within the scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A robot arm, comprising:
   a pedestal;
   a support arm on the pedestal and configured to support a substrate;
   a driving system configured to drive the support arm to move; and
   a substrate alignment device connected to the support arm;
   wherein the substrate alignment device comprises:
   a first position information collection unit configured to acquire first position information of the substrate when the substrate is on the support arm at a first position;
   a deviation information acquisition unit configured to acquire position deviation information of the substrate in accordance with the first position information and second position information of the substrate when the substrate is located at a standard position; and
   an adjustment unit configured to generate control information in accordance with the position deviation information, thereby driving the support arm by the driving system to place the substrate at a target position;
   wherein the first position information collection unit comprises a first image sensor and a second image sensor on the pedestal at positions corresponding to two opposite sides of the support arm respectively;
   a first positioning mark corresponding to the first image sensor and a second positioning mark corresponding to the second image sensor are on the substrate; and
   in the case that the substrate is located at the standard position, the first positioning mark coincides with a central point of a viewing field of the first image sensor, and the second positioning mark coincides with a central point of a viewing field of the second image sensor.

2. The robot arm according to claim 1, further comprising a storage unit configured to store therein the second position information and target position information.

3. The robot arm according to claim 1, wherein when the substrate is located at the standard position, the central point of the viewing field of the first image sensor on the substrate, the central point of the viewing field of the second image sensor on the substrate and a central point of the substrate are in an identical straight line.

4. The robot arm according to claim 1, wherein the driving system comprises:
   a first driving mechanism configured to control the support arm to move in a first direction in accordance with the control information from the adjustment unit;
   a second driving mechanism configured to control the support arm to move in a second direction perpendicular to the first direction in accordance with the control information from the adjustment unit; and a third driving mechanism configured to control the support arm to rotate in accordance with the control information from the adjustment unit.

5. The robot arm according to claim 4, wherein the position deviation information comprises a first deviation amount Y, a second deviation amount and an angular deviation amount θ;

the first deviation amount Y meets a formula $Y=(Y_{2k}-Y_{1k})/2$, where $Y_{1k}$ represents a distance in the first direction between a position of the first positioning mark and the central point of the viewing field of the first image sensor on the substrate in the case that the substrate is located at a current position, and $Y_{2k}$ represents a distance in the first direction between a position of the second positioning mark and the central point of the viewing field of the second image sensor on the substrate in the case that the substrate is located at the current position;

the second deviation amount is a distance in the second direction between the position of the first positioning mark and the central point of the viewing field of the first image sensor on the substrate in the case that the substrate is located at the current position;

the distance in the second direction between the position of the first positioning mark and the central point of the viewing field of the first image sensor on the substrate is equal to a distance in the second direction between the position of the second positioning mark and the central point of the viewing field of the second image sensor on the substrate; and the angular deviation amount θ meets a formula $$\sin\theta = \frac{Y_{2k} - Y_{1k}}{L},$$

where $Y_{1k}$ represents the distance in the first direction between the position of the first positioning mark and the central point of the viewing field of the first image sensor on the substrate in the case that the substrate is located at the current position, $Y_{2k}$ represents the distance in the first direction between the position of the second positioning mark and the central point of the viewing field of the second image sensor on the substrate in the case that the substrate is located at the current position, and L represents a distance between the central point of the viewing field of the first image sensor on the substrate and the central point of the viewing field of the second image sensor on the substrate.

6. A method for aligning a substrate with a robot arm, wherein the robot arm includes: a pedestal, a support arm on the pedestal and configured to support a substrate, a driving system configured to drive the support arm to move, and a substrate alignment device connected to the support arm;

wherein the substrate alignment device comprises: a first position information collection unit configured to acquire first position information of the substrate when the substrate is on the support arm at a first position; a deviation information acquisition unit configured to acquire position deviation information of the substrate in accordance with the first position information and second position information of the substrate when the substrate is located at a standard position; and an adjustment unit configured to generate control information in accordance with the position deviation information, thereby driving the support arm by the driving system to place the substrate at a target position;

the method comprising:

acquiring the first position information of the substrate in the case that the substrate is on the support arm at the first position;

acquiring the position deviation information of the substrate in accordance with the first position information and the second position information of the substrate in the case that the substrate is located at the standard position; and generating the control information in accordance with the position deviation information, thereby enabling the driving system to drive the support arm to move, thereby to place the substrate at the target position;

wherein the first position information collection unit of the robot arm comprises a first image sensor and a second image sensor on the pedestal at positions corresponding to two opposite sides of the support arm respectively;

the first position information is acquired by the first image sensor and the second image sensor, and a first positioning mark corresponding to the first image sensor and a second positioning mark corresponding to the second image sensor are on the substrate; and in the case that the substrate is located at the standard position, a central point of a viewing field of the first image sensor on the substrate, a central point of a viewing field of the second image sensor on the substrate and a central point of the substrate are in an identical straight line.

7. The method according to claim 6, wherein the position deviation information comprises a first deviation amount Y, a second deviation amount and an angular deviation amount θ;

the first deviation amount Y meets a formula $Y=(Y_{2k}-Y_{1k})/2$, where $Y_{1k}$ represents a distance in a first direction between a position of the first positioning mark and the central point of the viewing field of the first image sensor on the substrate in the case that the substrate is located at a current position, and $Y_{2k}$ represents a distance in the first direction between a position of the second positioning mark and the central point of the viewing field of the second image sensor on the substrate in the case that the substrate is located at the current position;

the second deviation amount is a distance in a second direction between the position of the first positioning mark and the central point of the viewing field of the first image sensor on the substrate in the case that the substrate is located at the current position;

the distance in the second direction between the position of the first positioning mark and the central point of the viewing field of the first image sensor on the substrate is equal to a distance in the second direction between the position of the second positioning mark and the central point of the viewing field of the second image sensor on the substrate; and the angular deviation amount θ meets a formula $$\sin\theta = \frac{Y_{2k} - Y_{1k}}{L},$$

where $Y_{1k}$ represents the distance in the first direction between the position of the first positioning mark and the central point of the viewing field of the first image sensor on the substrate in the case that the substrate is located at the current position, $Y_{2k}$ represents the distance in the first direction between the position of the second positioning mark and the central point of the viewing field of the second image sensor on the substrate in the case that the substrate is located at the current position, and L represents a distance between the central point of the viewing field of the first image sensor on the substrate and the central point of the viewing field of the second image sensor on the substrate.

8. The method according to claim 7, further comprising:
controlling the support arm to move in the first direction in accordance with the first deviation amount;
controlling the support arm to move in the second direction perpendicular to the first direction in accordance with the second deviation amount; and
controlling the support arm to rotate in accordance with the angular deviation amount.

9. The method according to claim 6, wherein the robot arm further comprises a storage unit configured to store therein the second position information and target position information.

10. A robot arm, comprising:
a pedestal;
a support arm on the pedestal and configured to support a substrate;
a driving system configured to drive the support arm to move; and
a substrate alignment device connected to the support arm;
wherein the substrate alignment device comprises:
a first position information collection unit configured to acquire first position information of the substrate when the substrate is on the support arm at a first position;
a deviation information acquisition unit configured to acquire position deviation information of the substrate in accordance with the first position information and second position information of the substrate when the substrate is located at a standard position; and
an adjustment unit configured to generate control information in accordance with the position deviation information, thereby driving the support arm by the driving system to place the substrate at a target position;
wherein the first position information collection unit comprises an image sensor on the pedestal and below the support arm; and in the case that the substrate is located at the standard position, a predetermined positioning mark on the substrate coincides with a central point of a viewing field of the image sensor.

* * * * *